United States Patent
Takase et al.

(10) Patent No.: US 6,361,597 B1
(45) Date of Patent: Mar. 26, 2002

(54) SINGLE CRYSTAL MATERIAL AUXILIARY MELTING APPARATUS AND SINGLE CRYSTAL MATERIAL MELTING METHOD

(75) Inventors: Nobumitsu Takase; Tomohisa Machida; Yutaka Shiraishi, all of Annaka (JP)

(73) Assignee: Super Silicon Crystal Research Institute Corp., Gunma (JP)

(*) Notice: Subject to any disclaimer, the term of this patent is extended or adjusted under 35 U.S.C. 154(b) by 0 days.

(21) Appl. No.: 09/403,621

(22) PCT Filed: Dec. 4, 1998

(86) PCT No.: PCT/JP98/05477
§ 371 Date: Nov. 5, 1999
§ 102(e) Date: Nov. 5, 1999

(87) PCT Pub. No.: WO99/46432
PCT Pub. Date: Sep. 16, 1999

(30) Foreign Application Priority Data

Mar. 12, 1998 (JP) .......................... 10-080345
Mar. 12, 1998 (JP) .......................... 10-080349

(51) Int. Cl.[7] .......................... C30B 15/00; C30B 35/00
(52) U.S. Cl. .......................... 117/18; 117/214
(58) Field of Search .......................... 117/200, 213, 117/214, 208, 13, 18

(56) References Cited

U.S. PATENT DOCUMENTS

| 4,265,859 A | * | 5/1981 | Jewett .......................... 422/199 |
| 4,968,380 A | * | 11/1990 | Freedman et al. .......... 156/608 |
| 5,324,488 A | * | 6/1994 | Klingshirn et al. .......... 117/213 |
| 5,360,480 A | * | 11/1994 | Altekruger .................. 117/214 |
| 5,373,805 A | * | 12/1994 | Takano et al. ................ 117/18 |
| 5,427,056 A | * | 6/1995 | Imai et al. .................... 117/214 |
| 5,820,649 A | * | 10/1998 | Ogure et al. .................... 65/66 |

FOREIGN PATENT DOCUMENTS

| JP | 355130894 A | * | 10/1980 | ........... C30B/15/14 |
| JP | 356164097 A | * | 12/1981 | ........... C30B/15/00 |
| JP | 403215383 A | * | 9/1991 | ......... H01L/21/208 |

* cited by examiner

*Primary Examiner*—Benjamin L. Utech
*Assistant Examiner*—Matthew A. Anderson
(74) *Attorney, Agent, or Firm*—Connolly Bove Lodge & Hutz LLP

(57) ABSTRACT

The present invention aims to improve thermal efficiency and to reduce melting time when a raw material in an auxiliary crucible is heated and melted by induction heating method. When an initial raw material 30a is at low temperature and its conductivity is relatively low, a conductive carbon cylinder 2 is arranged at such a height as to cover the entire side wall of the auxiliary crucible 1, and when high frequency current is applied on a high frequency coil 3, secondary induction current is generated on the carbon cylinder 2. Then, Joule heat is generated on the carbon cylinder 2 by the secondary induction current, and heat of the carbon cylinder 2 is transmitted to the raw material inside via the auxiliary crucible 1. Thus, the raw material is heated, and melting is started. When the raw material is melted, an insulating ceramic base 4 is arranged at such a position as to cover the entire side wall of the auxiliary crucible 1. Because conductivity of the raw material is gradually increased, secondary induction current is generated in the melt 30b, and Joule heat is generated in the melt 30b itself by the secondary induction current.

15 Claims, 5 Drawing Sheets

SINGLE CRYSTAL MATERIAL AUXILIARY MELTING APPARATUS AND SINGLE CRYSTAL MATERIAL MELTING METHOD

TECHNICAL FIELD

The present invention relates to a single crystal material auxiliary melting apparatus and a single crystal material melting method for heating and melting a single crystal material in an auxiliary crucible and for supplying the melt to a main crucible in a single crystal pulling apparatus for manufacturing dislocation-free single crystal of silicon (Si) by Czochralski pulling method.

BACKGROUND ART

In general, in a single crystal manufacturing apparatus based on Czochralski pulling method, the pressure in a highly pressure-resistant airtight chamber is reduced to about 10 torr and fresh argon (Ar) gas is supplied into it, and polycrystal in a quartz crucible installed in the lower portion of the chamber is heated and melted. A seed crystal is immersed from above into the surface of the melt. Then, the seed crystal and quartz crucible are rotated and moved up and down, and the seed crystal is pulled so that a single crystal (the so-called ingot) is grown, which comprises an upper cone portion in conical shape with its upper end protruding under the seed crystal, a body portion in cylindrical shape, and a lower cone portion in conical shape with its lower end protruding.

As a conventional method to melt the raw material in an apparatus as described above, a method for supplying raw material to supplement the decrease of the melt in a crucible (hereinafter referred as "main crucible") for pulling up single crystal has been proposed. For example, JP-A-55-130894 discloses a method for melting raw material in an auxiliary crucible communicated with a main crucible and for additionally supplying the melt from the auxiliary crucible to the main crucible via a communicating pipe. Also, JP-A-56-164097 describes a method for supplying and melting solid raw material in an auxiliary crucible in a pulling apparatus from outside the pulling apparatus and for additionally supplying the melt from the auxiliary crucible to the main crucible.

In the past, as the methods for heating and melting raw material of single crystal in an auxiliary crucible, resistance heating method and induction heating method have been known. In the resistant heating method, a resistance heater is disposed around the auxiliary crucible, and heat is generated by applying DC voltage on the heater, and the raw material inside is heated via the auxiliary crucible. In the induction heating method, a coil is installed around the auxiliary crucible, and by applying AC voltage on the heater, secondary induction current is generated on the raw material in the auxiliary crucible. Then, Joule heat is generated on the raw material by the secondary induction current, and the raw material is melted.

In the resistance heating method as described above, however, the heat generated by the heater is indirectly transmitted to the raw material inside via the auxiliary crucible, and thermal efficiency is not very high. As a result, melting time becomes longer, and the auxiliary crucible which is made of quartz and is easily deteriorated at high temperature must be heated to unnecessarily high temperature. Further, the auxiliary crucible must be rotated to stir up the raw material, and this requires a system with more complicated structure.

Also, in a conventional example based on the induction heating method as described above, conductivity of silicon is low at low temperature and high at high temperature. This leads to the problem that thermal efficiency is low at the initial heating. Accordingly, when this method is used, induction heating must be started after a part of raw material is melted at the initial heating and supplied into the auxiliary crucible in order to reduce the melting time.

DISCLOSURE OF THE INVENTION

To overcome the above problems, it is an object of the present invention to provide a single crystal material auxiliary melting apparatus and a single crystal material melting method, by which it is possible to improve thermal efficiency and to reduce melting time when the raw material in the auxiliary crucible is heated and melted by induction heating method.

According to a first invention of the present application, when the raw material is at low temperature and its conductivity is relatively low, secondary induction current is generated on a susceptor and heat of the susceptor is transmitted to the raw material in the auxiliary crucible, and when the raw material is at high temperature and its conductivity is relatively high, the susceptor is moved aside and secondary induction current is generated on the raw material in the auxiliary crucible, and heat is generated in the raw material itself.

Specifically, the first invention of the present application provides a single crystal material auxiliary melting apparatus for heating and melting a single crystal raw material in an auxiliary crucible and for supplying the melt into a main crucible, the apparatus comprising:

a conductive susceptor arranged around the auxiliary crucible so that it can be moved in vertical direction;

a coil wound around the susceptor and with high frequency current applied thereon; and means for moving the susceptor in such manner that heating of the raw material in the auxiliary crucible is started by arranging the susceptor at a high position on the auxiliary crucible and by heating the susceptor with secondary induction current the susceptor is moved aside from the position on the auxiliary crucible after melting of the raw material has been started, and the raw material in the auxiliary crucible is heated by secondary induction current.

The first invention of the present application also provides a single crystal material melting method in a single crystal material auxiliary melting apparatus, which comprises an auxiliary crucible for heating and melting a single crystal raw material and for supplying the melt into a main crucible, a conductive susceptor arranged around the auxiliary crucible so that the susceptor can be moved in vertical direction, and a coil wound around the susceptor and with high frequency current applied thereon, whereby the method comprises the steps of:

starting to heat the raw material in the auxiliary crucible by arranging the susceptor at a high position on the auxiliary crucible and by generating heat on the susceptor with secondary induction current; and moving the susceptor aside from the high position on the auxiliary crucible after melting of the raw material has been started, and generating heat on the raw material in the auxiliary crucible by secondary induction current.

In a second invention of the present application, in order to attain the above object, a mass of the raw material is placed on an opening of a pipe to block it and a susceptor is arranged at a position no to heat the mass of the raw material and heating is started, and after the melting of the raw material has been started, the susceptor is arranged at a position to heat the mass of the raw material and the raw material above it, and heat is generated on both the susceptor and the raw material by secondary induction current.

Specifically, the second invention of the present application provides a single crystal material auxiliary melting apparatus for heating and melting a single crystal raw material in an auxiliary crucible and for supplying the melt into a main crucible, the apparatus comprising:

a conductive susceptor arranged around the auxiliary crucible so that it can be moved in vertical direction;

a coil wound around the susceptor and with high frequency current applied thereon;

a pipe having an opening to supply the melt from the auxiliary crucible into the main crucible and formed on the bottom wall of the auxiliary crucible;

means for starting to heat the raw material in the auxiliary crucible by generating heat on the susceptor with secondary induction current and by arranging the susceptor at such a height that a mass of the raw material is not heated and the raw material above the mass is heated, while the mass of the raw material blocks opening of the pipe; and means for generating heat on both the susceptor and the raw material with secondary induction current and by arranging the susceptor at such a height that the mass of the raw material and the raw material above the mass are heated after melting of the raw material has been started.

Also, the second invention provides a single crystal material melting method in a single crystal material auxiliary melting apparatus, which comprises an auxiliary crucible for heating and melting a single crystal raw material and for supplying the melt into a main crucible, a conductive susceptor arranged around the auxiliary crucible in such manner that the susceptor can be moved in vertical direction, a coil wound around the susceptor and with high frequency current applied thereon, and a pipe with an opening for supplying the melt from the auxiliary crucible into the main crucible, the pipe being formed on bottom wall of the auxiliary crucible, whereby the method comprises the steps of:

arranging the susceptor at such a height as not to heat the raw material mass but to heat the raw material above the mass with the raw material mass placed on the opening of the pipe, and starting to heat the raw material in the auxiliary crucible by generating heat on the susceptor due to the secondary induction current; and arranging the susceptor at such a height to heat the raw material mass and the raw material above the mass after melting of the raw material has been started, and generating heat on both of the susceptor and the raw material due to secondary induction current.

Further, according to a third invention of the present application, in order to attain the above object, when the raw material is at low temperature and its conductivity is relatively low, secondary induction current is generated on the susceptor and heat of the susceptor is transmitted to the raw material in the auxiliary crucible, and when the raw material is at high temperature and its conductivity is relatively high, secondary induction current is generated in both the susceptor and the raw material inside the auxiliary crucible, and heat of the susceptor is transmitted to the raw material in the auxiliary crucible and heat is generated in the raw material itself. Also, by switching over the frequency of the high frequency current to be applied during the melting process, the melting time can be reduced further.

The third invention of the present application provides a single crystal material auxiliary melting apparatus for heating and melting a single crystal raw material in an auxiliary crucible and for supplying the melt into a main crucible, said apparatus comprising:

a conductive susceptor for supporting the auxiliary crucible; and a coil wound around the susceptor and with high frequency current applied thereon, whereby:

thickness of the susceptor and frequency applied on the coil are selected in such manner than the thickness of the susceptor will be thinner than penetration depth of the secondary induction current.

Also, the third invention of the present application provides a single crystal material auxiliary melting apparatus for heating and melting a single crystal raw material in an auxiliary crucible and for supplying the melt into a main crucible, the apparatus comprising:

a conductive susceptor for supporting the auxiliary crucible; and a coil wound around the susceptor and with high frequency current applied thereon, whereby:

heating in the auxiliary crucible is started by applying electric current with relatively high first frequency on the coil and electric current with relative low second frequency is applied after melting of the raw material has been started.

Further, the third invention of the present application provides a single crystal material melting method in a single crystal material auxiliary melting apparatus for heating and melting a single crystal raw material in an auxiliary crucible and for supplying the melt into a main crucible, the apparatus comprising a conductive susceptor for supporting the auxiliary crucible, and a coil wound around the susceptor and with high frequency current applied thereon, whereby the method comprises the steps of:

applying electric current with relatively high first frequency on the coil and starting to heat the material in the auxiliary crucible; and applying electric current of relatively low second frequency after melting of the raw material has been started.

BRIEF DESCRIPTION OF THE DRAWINGS

The objects and features of the present invention as described above will become more apparent by the detailed description given below in connection with the attached drawings.

BEST MODE FOR CARRYING OUT THE INVENTION

Figure 1:
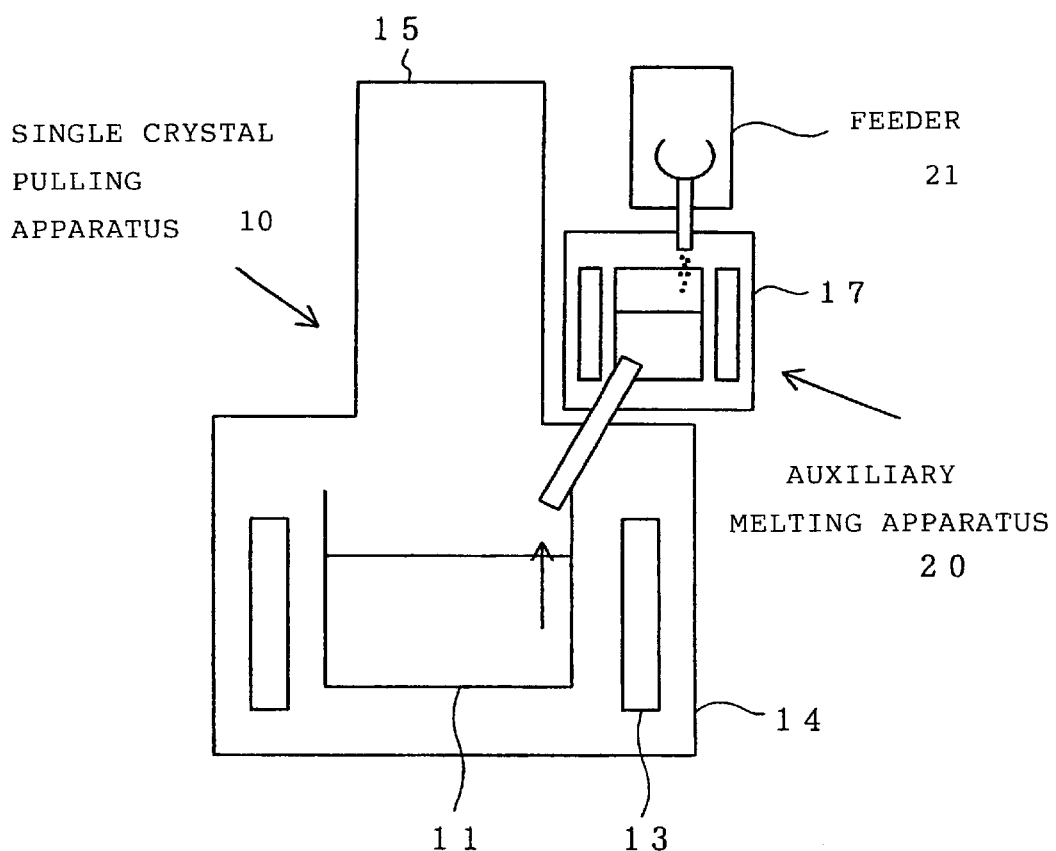
FIG. 1 is a schematical drawing to show a single crystal pulling apparatus, to which a first embodiment of a single crystal material auxiliary melting apparatus of the present invention is applied.
Figure 2:
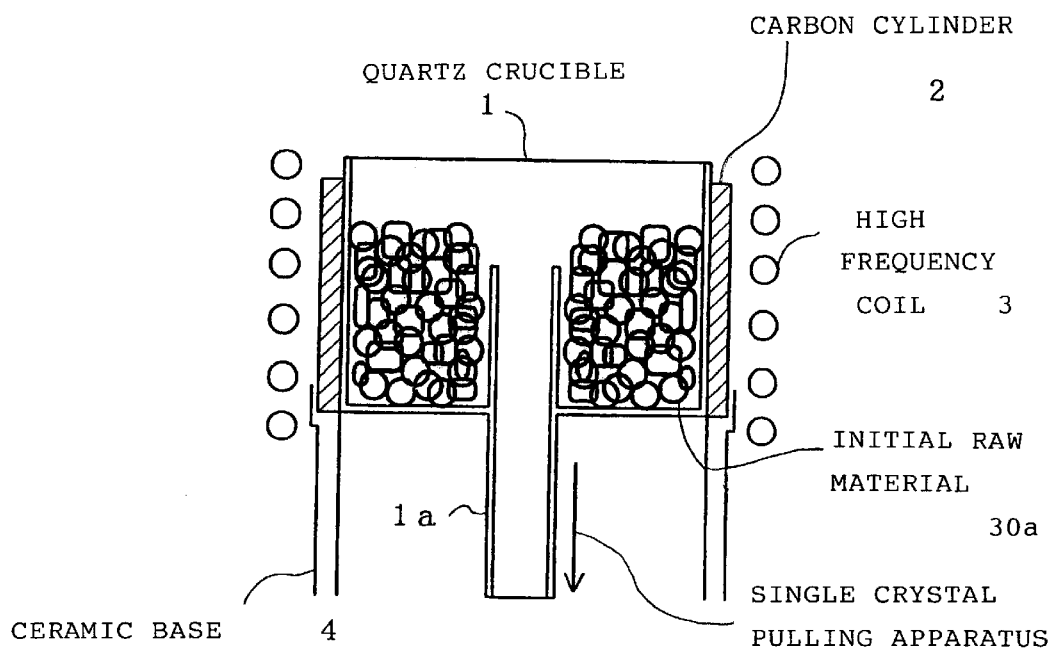
FIG. 2 is a drawing to show an auxiliary melting process of an auxiliary melting apparatus shown in FIG. 1.
Figure 3:
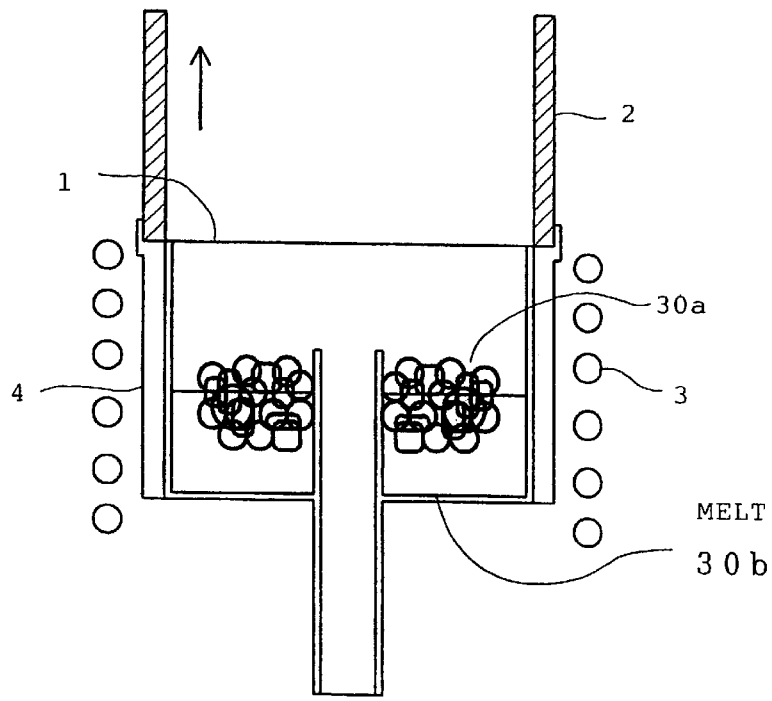
FIG. 3 is a drawing to show an auxiliary melting process of an auxiliary melting apparatus shown in FIG. 1.
Figure 4:
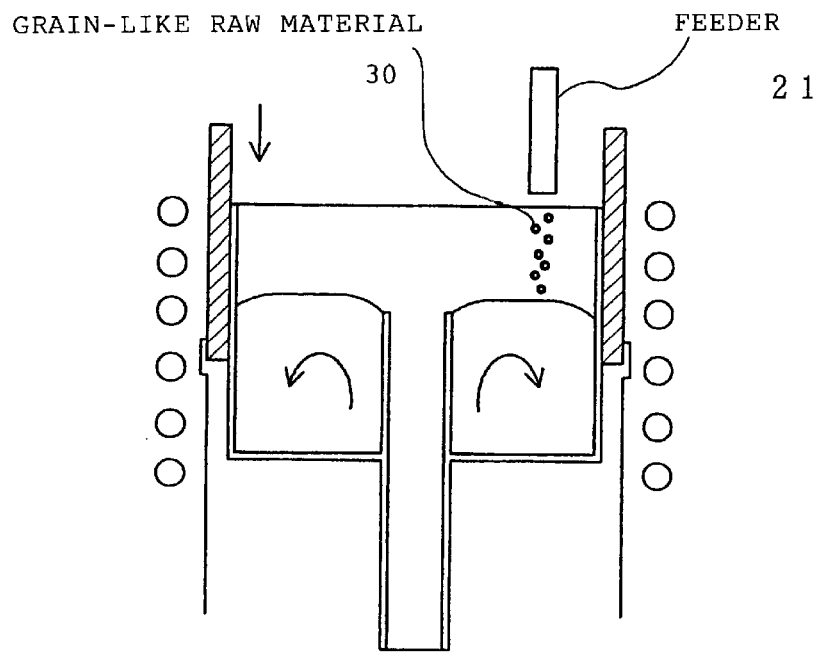
FIG. 4 is a drawing to show an auxiliary melting process of an auxiliary melting apparatus shown in FIG. 1.

In the following, description will be given on embodiments of the present invention referring to the attached drawings. FIG. 1 is a schematical drawing of a single crystal pulling apparatus, to which a first embodiment of a single crystal material auxiliary melting apparatus of the present invention is applied. FIG. 2 to FIG. 4 each represents a drawing to explain an auxiliary melting process of the auxiliary melting apparatus of FIG. 1.

In a single crystal pulling apparatus 10 shown in FIG. 1, a heater of cylindrical shape (not shown) is arranged around a main crucible 11 made of quartz, and a heat insulating material 13 of cylindrical shape is disposed around the heater. These component members 11 and 13 are arranged within a lower chamber 14. Although not shown in the figure, the main crucible 11 is supported by a carbon crucible, and the main crucible 11 and the carbon crucible are rotatably supported around a shaft so that these crucibles can be moved up and down in vertical direction. Also, an upper chamber 15 is disposed above the lower chamber 14, and a cable for pulling up the single crystal is suspended from the upper chamber 15 so that it can be moved in vertical direction and can be rotated around a shaft.

Also, an auxiliary chamber 17 is arranged above the lower chamber 14, and an auxiliary melting apparatus 20 as shown in detail in FIGS. 2 to 4 is placed in the auxiliary chamber 17 in order to supply the melt into the main crucible 11. Further, above the auxiliary melting apparatus 20, a feeder 21 for supplying solid grain-like material, i.e. raw material for the single crystal, is arranged. The inner space of the lower chamber 14 is communicated with the inner spaces of the upper chamber 15 and the auxiliary chamber 17, and these spaces are maintained at low pressure and are filled with inert gas such as argon.

Now, detailed description will be given on the auxiliary melting apparatus 20 referring to FIG. 2 to FIG. 4. At the center of the auxiliary crucible 1 made of quartz, a pipe 1a for supplying the melt from the auxiliary crucible 1 into the main crucible 11 by overflow is installed so that an opening at the upper end of the pipe 1a is protruded at a position about ½ of the height of the auxiliary crucible 1. Around the auxiliary crucible 1, a carbon cylinder (carbon crucible) 2, serving as a conductive susceptor, is arranged in such manner that it can be moved up and down in vertical direction.

A high frequency coil 3 is disposed around the carbon cylinder 2, and the lower end of the carbon cylinder 2 is supported by an insulating ceramic base 4 in cylindrical shape made of a material such as $Si_3N_4$. The carbon cylinder 2 is assembled with the ceramic base 4 so that these can be integrally moved in vertical direction, and the high frequency coil 3 is fixed at such a position as to match the auxiliary crucible 1. Here, secondary induction current is likely to concentrate on the surface of a conductive member, and this tendency is more remarkable at higher frequency. In this respect, thickness of the carbon cylinder 2 and frequency applied on the high frequency coil 3 are selected in such manner that the thickness of the carbon cylinder 2 will be thinner than penetration depth of the secondary induction current.

FIG. 2 shows a condition prior to the melting process, FIG. 3 shows a condition during melting process, and FIG. 4 shows a condition when melting process is completed. When a raw material 30 is not yet melted, i.e. when an initial raw material 30a is at low temperature and its conductivity is relatively low, the conductive carbon cylinder 2 is arranged at such a height that it covers the entire side wall of the auxiliary crucible 1. If high frequency current is applied on the high frequency coil 3 under this condition, secondary induction current is generated on the carbon cylinder 2, and Joule heat is generated on the carbon cylinder 2 due to the secondary induction current. In this case, the secondary induction current is not generated almost at all because the conductivity of the initial raw material 30a is lower than that of high temperature. Therefore, the heat of the carbon cylinder 2 is transmitted to the raw material inside via the auxiliary crucible 1. As a result, the raw material is heated, and melting is started as shown in FIG. 3.

When the raw material is in melting process (30b in the figure) as shown in FIG. 3, the carbon cylinder 2 and the ceramic base 4 are both moved upward and the insulating ceramic base 4 is arranged at such a height that the entire side wall of the auxiliary crucible 1 is covered. In this case, conductivity of the raw material is gradually increased and secondary induction current is generated in the melt 30b, and Joule heat is generated on the melt 30b itself by the secondary induction current.

Next, as shown in FIG. 4, melting process proceeds. Conductivity of the raw material reaches the maximum value, and the secondary induction current inside the raw material also reaches the maximum value. By magnetic field generated by the high frequency coil 3, the melt 30b is moved by convection, and self-stirring occurs. Under this condition, grain-like raw material 30 is added into the auxiliary crucible 1 via the feeder 21. Then, the carbon cylinder 2 and the ceramic base 4 are both moved downward, and the conductive carbon cylinder 2 covers upper half of the side wall of the auxiliary crucible 1, and the insulating ceramic base 4 is positioned at such a height to cover lower half of the side wall of the auxiliary crucible 1. As a result, the melt 30b in the auxiliary crucible 1 overflows into the pipe 1a and it is supplied to the main crucible 11 via the pipe 1a. Because heat is generated on the carbon cylinder 2, the added grain-like raw material 30 is heated as the result of heat transfer, and melting rate is increased. In this case, heat is generated on the melt 30b in the auxiliary crucible 1 by the secondary induction current.

Next, description will be given on a second embodiment of the invention referring to FIG. 5. In this embodiment, a pipe 1b for supplying the melt from the auxiliary crucible 1 into the main crucible 11 is not protruded upward from bottom wall of the auxiliary crucible 1, and an opening is formed on the bottom wall of the auxiliary crucible 1. The other arrangement is the same as in the first embodiment.

Figure 5:
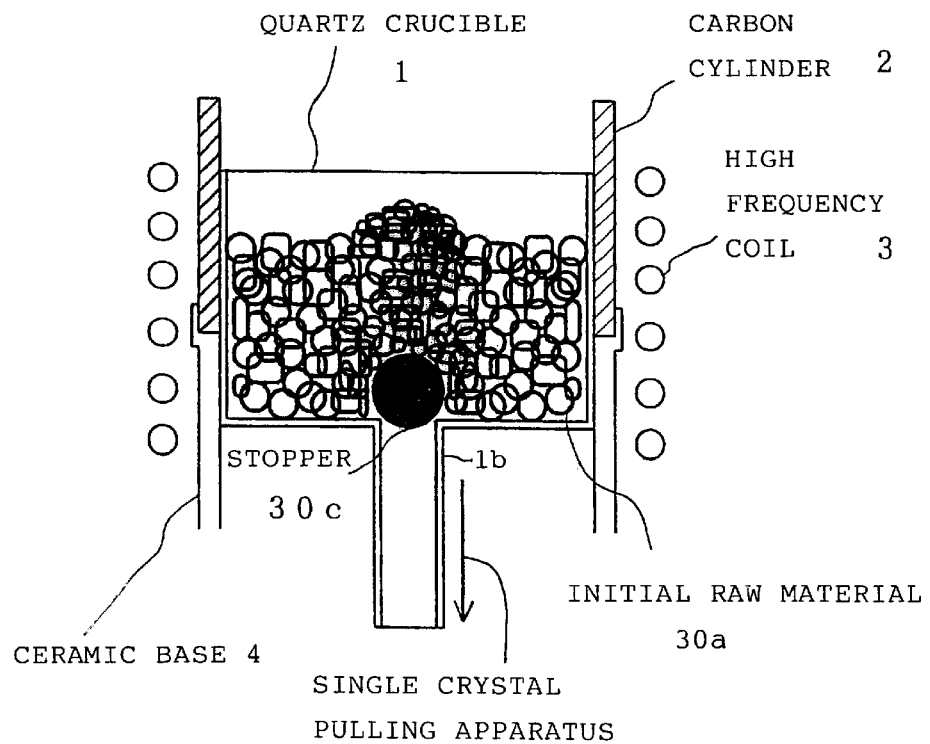
FIG. 5 is a drawing to show an auxiliary melting process of an auxiliary melting apparatus of a second embodiment of the present invention.
Figure 6:
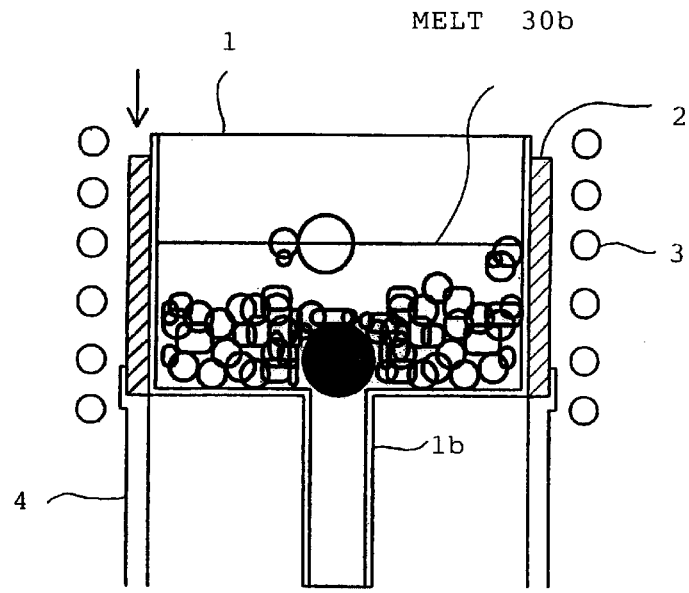
FIG. 6 is a drawing to show an auxiliary melting process of an auxiliary melting apparatus of a second embodiment of the present invention.
Figure 7:
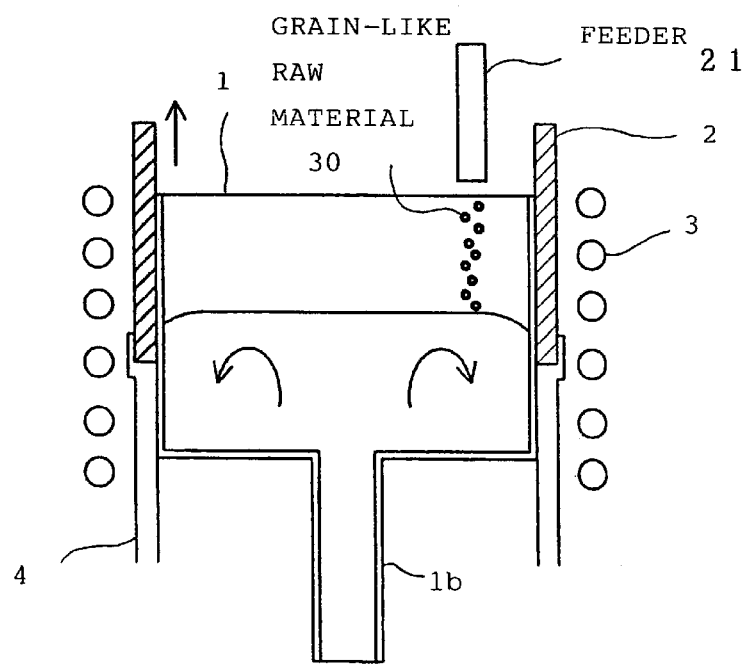
FIG. 7 is a drawing to show an auxiliary melting process of an auxiliary melting apparatus of a second embodiment of the present invention.

FIG. 5 shows a condition prior to the melting, FIG. 6 shows a condition during melting process, and FIG. 7 shows a condition at the completion of melting process. First, when the raw material 30 is still before being melted as shown in FIG. 5, i.e. when the initial raw material 30a is at low temperature and its conductivity is relatively low, a mass 30c of the initial raw material 30a is disposed at the opening of the pipe 1b as if it serves as a stopper. In order to prevent the mass 30c serving as stopper from being melted, the conductive carbon cylinder 2 covers about ⅔ of the upper portion of the side wall of the auxiliary crucible 1, and the insulating ceramic base 4 is positioned at such a height as to cover about ⅓ of the upper portion of the side wall of the auxiliary crucible 1. When high frequency current is applied on the high frequency coil 3 under this condition, secondary induction current is generated on the carbon cylinder 2, and Joule heat is generated on the carbon cylinder by the secondary induction current. Then, the heat of the carbon cylinder 2 is transmitted to about ⅔ of the upper portion of the raw material inside via the auxiliary crucible 1. As a result, the raw material is heated, and melting is started as shown in FIG. 6.

Next, when the raw material is in melting process (30b in the figure) as shown in FIG. 6, the carbon cylinder 2 and the ceramic base 4 are both moved downward, and the conductive carbon cylinder 2 is positioned at such a height as to cover the entire side wall of the auxiliary crucible 1. In this case, conductivity of the raw material is gradually increased and secondary induction current is generated on both the carbon cylinder 2 and the melt 30b, and Joule heat is generated on the melt 30b itself because of the secondary induction current.

Next, as shown in FIG. 7, melting process proceeds, and conductivity of the raw material reaches the maximum value, and the secondary induction current inside the raw material also reaches the maximum value. By magnetic field generated by the high frequency coil 3, the melt 30b is moved by convection, and self-stirring occurs. The mass 30c is melted, and the melt 30b inside the auxiliary crucible 1 is supplied into the main crucible 11 via the pipe 1b. Then, the grain-like raw material 20 is added into the auxiliary crucible 1 via the feeder 21. Both the carbon cylinder 2 and the ceramic base 4 are moved downward, and the conductive carbon cylinder 2 covers upper half of the side wall of the auxiliary crucible 1, and the insulating ceramic base 4 is positioned at such a height as to cover lower half of the side wall of the auxiliary crucible 1. Therefore, the melt 30b in the auxiliary crucible 1 is continuously supplied through the pipe 1a. Because heat is generated on the carbon cylinder 2, the added grain-like raw material 30 is heated by heat transfer, and melting rate is increased. Also, heat is generated in the melt 30b inside the auxiliary crucible 1 due to secondary induction current. Accordingly, it is possible by this method and by special arrangement on diameter and shape of the opening of the pipe 1b, it is possible to continuously supply the melt 30b.

Next, detailed description will be given on a third embodiment of an auxiliary melting apparatus of the present invention referring to FIG. 8. At the center of the auxiliary crucible 1 made of quartz, a pipe 1a is formed to supply the melt from the auxiliary crucible 1 to the main crucible 11 by overflow. The pipe 1a is arranged in such manner that an opening on the upper end of the pipe 1a protrudes at a position about ½ of the height of the auxiliary crucible 1. The auxiliary crucible 1 is supported by a conductive susceptor 2 (carbon crucible or carbon cylinder) so that lateral side and bottom surface are covered, and a high frequency coil 3 is disposed around the susceptor 2. Here, secondary induction current is likely to concentrate on the surface of a conductive member, and this tendency becomes more remarkable at higher frequency. For this reason, thickness of the conductive susceptor 2 and the frequency applied on the high frequency coil 3 are selected in such manner that the thickness of the conductive susceptor 2 will be thinner than penetration depth of the secondary induction current.

Figure 8A:
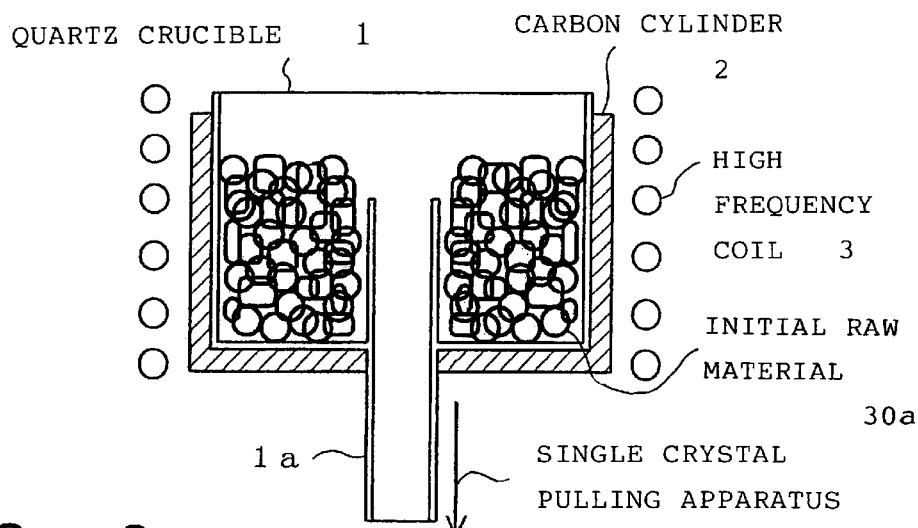
FIGS. 8(a), 8(b) and 8(c) each represents an auxiliary melting process of an auxiliary melting apparatus of a third embodiment of the present invention.
Figure 8B:
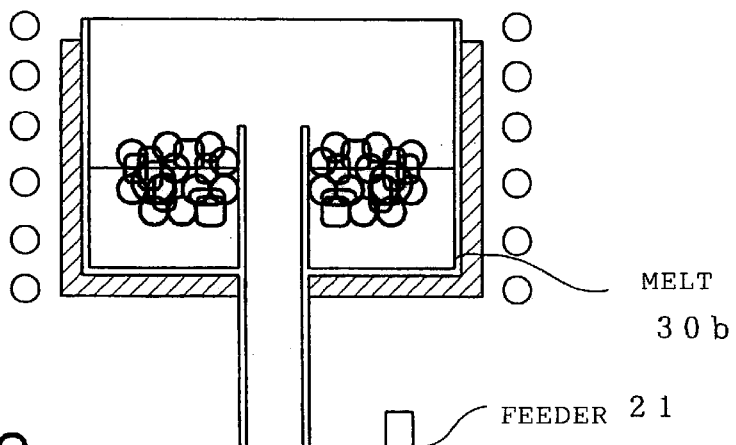
Figure 8C:
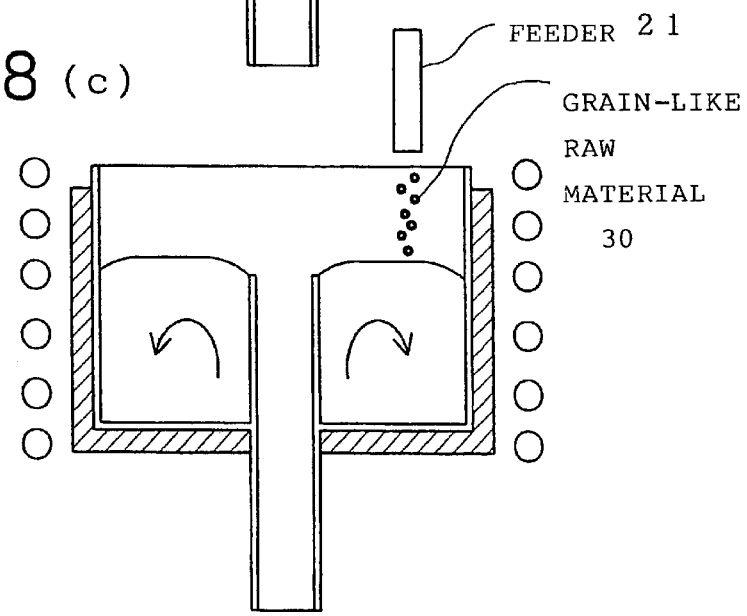

FIG. 8(a) shows a condition prior to melting, FIG. 8(b) shows a condition during melting process, and FIG. 8(c) shows a condition at the completion of melting process. As shown in FIG. 8(a), if high frequency current is applied on the high frequency coil 3 when the raw material 30 is till before being melted, i.e. when the initial raw material 30a is at low temperature and its conductivity is relatively low, secondary induction current is generated on the conductive susceptor 2, and Joule heat is generated on the conductive susceptor 2 by the secondary induction current. In this case, conductivity of the initial raw material 30a is lower than that of high temperature, and secondary induction current is not generated almost at all. Therefore, heat of the conductive susceptor 2 is transmitted to the raw material inside via the auxiliary crucible 1. As a result, the raw material is heated, and melting process is started as shown in FIG. 8(b).

Next, when the raw material is in melting process (30b in the figure) as shown in FIG. 8(b), conductivity of the raw material is gradually increased, and secondary induction current is also generated in the melt 30b. In this case, heat of the conductive susceptor 2 is transmitted to the raw material inside via the auxiliary crucible 1, and Joule heat is generated on the melt 30b itself by the secondary induction current. Next, as shown in FIG. 8(c), when melting process proceeds and conductivity of the raw material reaches the maximum value and the secondary induction current in the raw material also reaches the maximum value. By magnetic field generated by high frequency coil 3, the melt 30b is moved by convection, and self-stirring occurs. When the raw material 30 is added into the auxiliary crucible 1 via the feeder 21 under this condition, the melt 30b in the auxiliary crucible 1 overflows into the pipe 1a and it is supplied to the main crucible 11 through the pipe 1a.

Next, description will be given on examples of the third embodiment and a conventional example. First, in a conventional example, 1 kg of the raw material Si was heated by resistance heating method, and melting time was 75 minutes (35 kWh). Next, in order to melt the same quantity of the raw material in the embodiment:

Coil 3 with inner diameter of 220 mm (10 turns), and
Susceptor 2 with thickness of 10 mm were used. As a first example of the third embodiment, electric current of 15 kW with a constant frequency (3 kHz) was applied on the coil 3 at the starting, and the raw material was melted. Then, AC current of 20 kW was applied at the additional charging of the material, and melting time was 30 minutes. Next, in a second example, electric current of 15 kW with relatively high frequency of 10 kHz was applied on the coil 3 at the starting as shown in FIG. 8(a). When the raw material is in melting process as shown in FIG. 8(b), electric current of 15 kW with relatively low frequency of 3 kHz was applied, and the raw material was melted. Then, at the time of additional charging shown in FIG. 8(c), AC current of 20 kW was applied, and melting time was 20 minutes.

INDUSTRIAL APPLICABILITY

As described above, according to the first invention, when the raw material is at low temperature and its conductivity is relatively low, secondary induction current is generated on the susceptor and heat of the susceptor is transmitted to the raw material in the auxiliary crucible. When the raw material is at high temperature and its conductivity is relatively high, the susceptor is moved aside and secondary induction current is generated in the raw material in the auxiliary crucible so the heat is generated in the raw material itself. As a result, it is possible to improve thermal efficiency when the raw material in the auxiliary crucible is heated and melted by induction heating method, and also to reduce the melting time.

According to the second invention, with the pipe opening blocked by a mass of the raw material, the susceptor is arranged at such a position that the mass of the raw material is not heated and heating is started. After the melting of the raw material is started, the susceptor is arranged at such a position to heat the mass of the raw material and the raw material above the mass, and heat is generated on both the susceptor and the raw material by secondary induction current. As a result, it is possible to improve thermal efficiency when the raw material in the auxiliary crucible is heated and melted by induction heating method, and also to reduce the melting time.

Further, according to the third invention, when the raw material is at low temperature and its conductivity is relatively low, secondary induction current is generated on the susceptor, and heat of the susceptor is transmitted to the raw material in the auxiliary crucible. When the raw material is at high temperature and its conductivity is relatively high, secondary induction current is generated in both the susceptor and the raw material in the auxiliary crucible and heat of the susceptor is transmitted to the raw material in the auxiliary crucible, and heat is generated in the raw material itself. As a result, it is possible to improve thermal efficiency when the raw material in the auxiliary crucible is heated and melted by induction heating method, and also to reduce the melting time. Also, by setting the frequency of the high frequency current to be applied to a higher value in the initial stage and by switching over to lower frequency during the process, it is possible to reduce the melting time further.

What is claimed is:

1. A single crystal material auxiliary melting apparatus for heating and melting a single crystal raw material in an auxiliary crucible and for supplying melt into a main crucible, said apparatus comprising:

a conductive susceptor arranged around said auxiliary crucible so that it can be moved in a vertical direction;

a coil wound around said susceptor and with high frequency current applied thereon; and means for moving said susceptor in such manner that heating of the raw material in said auxiliary crucible is started by arranging said susceptor at a high position on said auxiliary crucible and by heating said susceptor with secondary induction current, said susceptor is moved aside from said position on said auxiliary crucible after melting of said raw material has been started, and the raw material in said auxiliary crucible is heated by secondary induction current.

2. The single crystal material auxiliary melting apparatus according to claim 1, wherein there is provided means for moving the susceptor, an opening of a pipe for supplying melt from said auxiliary crucible into said main crucible by overflow is protruded by a height from a bottom surface of said auxiliary crucible, and when new raw material is added into said auxiliary crucible after said raw material has been melted, said susceptor is moved so that the height of the lower end of said susceptor is approximately aligned with the height of said pipe opening.

3. The single crystal material auxiliary melting apparatus according to claim 2, wherein thickness of said susceptor and frequency applied on said coil are selected in such manner that the thickness of said susceptor will be thinner than penetration depth of the secondary induction current, said penetration depth being determined by the frequency.

4. The single crystal material auxiliary melting apparatus according to claim 1, wherein thickness of said susceptor and the frequency of the current applied on said coil are selected in such manner that the thickness of said susceptor will be thinner than penetration depth of the secondary induction current, said penetration depth being determined by the frequency.

5. A single crystal material auxiliary melting apparatus for heating and melting a single crystal raw material in an auxiliary crucible and for supplying melt into a main crucible, said apparatus comprising:

a conductive susceptor arranged around said auxiliary crucible so that it can be moved in a vertical direction;

a coil wound around said susceptor and with high frequency current applied thereon; and a pipe having an opening to supply the melt from said auxiliary crucible into said main crucible and formed on the bottom wall of said auxiliary crucible, whereby:

means for starting to heat the raw material in said auxiliary crucible by generating heat on said susceptor with secondary induction current and by arranging said susceptor at such a height that a mass of said raw material is not heated and the raw material above the mass is heated, and the mass of the raw material blocks the opening of said pipe; and means for generating heat on both the susceptor and the raw material with secondary induction current and by arranging said susceptor at such a height that the mass of said raw material and the raw material above the mass are heated after melting of said raw material has been started.

6. A single crystal material melting method in a single crystal material auxiliary melting apparatus, which comprises an auxiliary crucible for heating and melting a single crystal raw material and for supplying melt into a main crucible, a conductive susceptor arranged around said auxiliary crucible so that said susceptor can be moved in a vertical direction, and a coil wound around said susceptor and with high frequency current applied thereon, whereby said method comprises the steps of:

starting to heat the raw material in said auxiliary crucible by arranging said susceptor at a high position on said auxiliary crucible and by generating heat on said susceptor with secondary induction current; and moving said susceptor aside from the high position on of the auxiliary crucible after melting of said raw material has been started, and generating heat on the raw material in said auxiliary crucible by secondary induction current.

7. The single crystal material melting method according to claim 6, said method being used in a single crystal material auxiliary melting apparatus, which comprises an opening of a pipe for supplying the melt from said auxiliary crucible into said main crucible by overflow and being protruded by a height from bottom surface of said auxiliary crucible, said method comprises the steps of:

adding new raw material into said auxiliary crucible after said raw material has been melted; and arranging in such manner that the position of the lower end of said susceptor is approximately aligned with the position of said pipe opening.

8. The single crystal material melting method according to claim 7, wherein thickness of said susceptor frequency applied on said coil are selected in such manner that the thickness of said susceptor will be thinner than penetration depth of the secondary induction current, said penetration depth being determined by the frequency.

9. The single crystal material melting method according to claim 6, wherein thickness of said susceptor and frequency applied on said coil are selected in such manner that the thickness of said susceptor will be thinner than penetration depth of the secondary induction current, said penetration depth being determined by the frequency.

10. A single crystal material auxiliary melting apparatus for heating and melting a single crystal raw material in an auxiliary crucible and for supplying melt into a main crucible, said apparatus comprising:

a conductive susceptor for supporting said auxiliary crucible; and a coil wound around said susceptor and with high frequency current applied thereon, whereby:

heating in the auxiliary crucible is started by applying electric current with relatively high first frequency on said coil and electric current with relative low second frequency is applied after melting of said raw material has been started.

11. The single crystal material auxiliary melting apparatus according to claim 10, wherein the thickness of said susceptor and said second frequency applied on said coil are selected in such manner that the thickness of said susceptor will be thinner than penetration depth of the secondary induction current, said penetration depth being determined by the frequency.

12. A single crystal material melting method in a single crystal material auxiliary melting apparatus for heating and melting a single crystal raw material in an auxiliary crucible and for supplying melt into a main crucible, said apparatus comprising:

a conductive susceptor for supporting said auxiliary crucible; and a coil wound around said susceptor and with high frequency current applied thereon, said method comprises the steps of:

applying electric current with relatively high first frequency on said coil and starting to heat the material in said auxiliary crucible; and applying electric current of relatively low second frequency after melting of said raw material has been started.

13. The single crystal material melting method according to claim 12, wherein thickness of said susceptor and said second frequency applied on said coil are selected in such manner that the thickness of said susceptor will be thinner than penetration depth of the second induction current, said penetration depth being determined by the frequency.

14. A single crystal material melting method in a single crystal material auxiliary melting apparatus, which comprises an auxiliary crucible for heating and melting a single crystal raw material and for supplying melt into a main crucible, a conductive susceptor arranged around said auxiliary crucible in such manner that said susceptor can be moved in a vertical direction, a coil wound around said susceptor and with high frequency current applied thereon, and a pipe with an opening for supplying the melt from said auxiliary crucible into said main crucible, said pipe being formed on a bottom wall of said auxiliary crucible, whereby said method comprises the steps of:

arranging said susceptor at such a position so that said susceptor covers a range of side wall of said auxiliary crucible starting from an upper end of said auxiliary crucible and so as not to heat said raw material mass but to heat the raw material above said mass with the raw material mass placed on the opening of said pipe, and starting to heat the raw material in said auxiliary crucible by generating heat on said susceptor due to the secondary induction current; and arranging said susceptor at such a height as to heat said raw material mass and the raw material above said mass after melting of said raw material has been started, and generating heat on both of said susceptor and said raw material due to secondary induction current.

15. A single crystal material auxiliary melting apparatus for heating and melting a single crystal raw material in an auxiliary crucible and for supplying melt into a main crucible, said apparatus comprising:

a conductive susceptor for supporting said auxiliary crucible; and a coil wound around said susceptor and with high frequency current applied thereon, whereby:

thickness of said susceptor and frequency applied on said coil are selected in such manner than the thickness of said susceptor will be thinner than penetration depth of the secondary induction current.

* * * * *